United States Patent [19]

Shimano et al.

[11] Patent Number: 4,702,797
[45] Date of Patent: Oct. 27, 1987

[54] METHOD OF MANUFACTURING SEMICONDUCTOR MEMORY DEVICE

[75] Inventors: Hiroki Shimano; Masahiro Shimizu; Katsuhiro Tsukamoto; Masahide Inuishi, all of Hyogo, Japan

[73] Assignee: Mitsubishi Denki Kabushiki Kaisha, Tokyo, Japan

[21] Appl. No.: 943,053

[22] Filed: Dec. 18, 1986

[30] Foreign Application Priority Data

Dec. 20, 1985 [JP] Japan ................................ 60-288207

[51] Int. Cl.$^4$ ...................... H01L 21/306; B44C 1/22; C03C 15/00; C03C 25/06
[52] U.S. Cl. .................................... 156/653; 437/27; 437/52; 437/41; 156/657; 156/659.1; 156/662; 357/23.6
[58] Field of Search ................ 29/571, 576 W, 577 R, 29/577 C, 578, 591; 427/88, 85; 148/1.5, 187, 190; 357/23.1, 23.6, 41, 49, 59, 65; 156/653, 657, 659.1, 662, 668, 661.1

[56] References Cited

U.S. PATENT DOCUMENTS 4,597,824 7/1986 Shinada et al. ................ 156/662 X

OTHER PUBLICATIONS

"Alpha-Particle-Induced Soft Error Rate in VLSI Circuits", George A. Sai-Halasz et al, IEEE Transactions on Electron Devices, vol. ED-29, No. 4, Apr. 1982, pp. 725-731.

Primary Examiner—William A. Powell
Attorney, Agent, or Firm—Lowe Price LeBlanc Becker & Shur

[57] ABSTRACT

A method of manufacturing a semiconductor device comprises the steps of forming memory cell portions (2, 4, 6, 11) on a p$^-$-type semiconductor substrate (1), forming a gate insulator film (5) and a gate electrode (3) each having a larger width, by approximately 1 μm, than the original width, ion-implanting p-type impurities utilizing the gate insulator film (5) and the gate electrode (3) as masks, to form p$^+$-type regions (120, 121), etching the side walls of the gate insulator film (5) and the gate electrode (3) to the original width and then, ion-implanting n-type impurities utilizing these regions as a mask, to form n$^+$-type regions (80, 81), and heat-treating these regions (80, 81, 120, 121), to form regions (80a, 81a, 120a, 121a). The p$^+$-type regions (120a, 121a) prevent passage of electrons out of electron-hole pairs induced by alpha rays, to prevent occurrence of soft errors. The p$^+$-type regions (120a, 121a) are located inside the n$^+$-type regions (80a, 81a), so that operation of a parasitic pnp transistor is not caused.

8 Claims, 6 Drawing Figures

METHOD OF MANUFACTURING SEMICONDUCTOR MEMORY DEVICE

BACKGROUND OF THE INVENTION

1. Field of the Invention

The present invention relates to a method of manufacturing a semiconductor memory device, and more particularly, it relates to a method of manufacturing a semiconductor memory device capable of preventing soft errors caused by radioactive rays such as alpha rays.

2. Description of the Prior Art

A dynamic RAM (Random Access Memory) which stores data depending on presence or absence of stored charges has been known as a semiconductor memory device.

FIG. 1 is a cross sectional view showing a structure of a peripheral portion of a memory cell in a 250K dynamic RAM as an example of such a conventional semiconductor memory device.

Description is now made on the structure of the peripheral portion of the memory cell shown in FIG. 1.

In FIG. 1, a p+-type region 10 for preventing inversion and parasitism is formed on a p−-type semiconductor substrate 1, and an insulator film 9 for isolating elements is formed on the p+-type region 10. In addition, a p+-type region 11 having higher impurity concentration, by one figure, than that of the substrate 1 is formed on the p−-type semiconductor substrate 1, and an n+-type region 6 serving as a charge storage region for storing data is formed on the p+-type region 11. Furthermore, a first gate insulator film 4 is formed on the n+-type region 6 and an insulator film 9, and a first gate electrode 2 connected to a power supply (not shown) through a terminal 20 is formed on the first gate insulator film 4. The n+-type region 6, the first gate insulator film 4 and the first gate electrode 2 constitute a memory cell.

Additionally, an n+-type region 80a serving as one source/drain region is formed in communication with the n+-type region 6 on the p−-type semiconductor substrate 1, and an n+-type region 81a serving as the other source/drain region is formed apart from the n+-type region 80a. The n+-type region 81a is connected to a bit line (not shown) and has a downward convex portion 7 in the center of the bottom portion. The convex portion serves to prevent the bit line from breaking through the bottom face of the n+-type region 81a and reaching the p−-type semiconductor substrate 1 when the bit line comes into contact with the n+-type region 81a. A second gate insulator film 5a is formed on the p−-type semiconductor substrate 1 between the n+-type regions 80a and 81a, an end of the n+-type region 80a and an end of the n+-type region 81a, and a second gate electrode 3a connected to a word line (not shown) through a terminal 30 in formed on the second gate insulator film 5a. The p−-type semiconductor substrate 1, the n+-type region 80a, the n+-type region 81a, the second gate insulator film 5a and the second gate electrode 3a constitute a transfer gate transistor.

For simplicity of illustration, an interlayer insulation film formed on the n+-type region 80a, the second gate electrode 3a and the n+-type region 81a, interconnection portions such as a bit line formed on the interlayer insulation film and a protective film formed on the interlayer insulation film and the interconnection portions are omitted in FIG. 1. Furthermore, instead of forming the n+-type region 6 serving as an impurity diffusion region, a positive potential may be applied to the first gate electrode 2 to induce an n+-type inversion layer in the portion on the p−-type semiconductor substrate 1 corresponding to the n+-type region 6, thereby to store charges therein.

Description is now made on the operation of the peripheral portion of the memory cell shown in FIG. 1.

In the semiconductor memory device shown in FIG. 1, a state in which electrons are stored in the n+-type region 6 serving as a charge storage region in the memory cell is defined as "0" and a state in which electrons are not stored therein is defined as "1". The potential of the n+-type region 81a connected to a bit line (not shown) is held at a predetermined intermediate level by a sense amplifier (not shown).

When the potential of a word line is increased and the potential of the second gate electrode 3a in the transfer gate transistor connected to the word line exceeds the threshold voltage, a channel of an n+-type inversion layer is formed directly under the second gate electrode 3a, whereby the channel is rendered conductive between the n+-type regions 6 and 80a and the n+-type region 81a.

If and when storage data of the memory cell is "0", that is, when electrons are stored in the n+-type region 6, the potential of the n+-type region 81a, which has been so far held at an intermediate level, is decreased by conduction between the n+-type regions 6 and 80a and the n+-type region 81a connected to a bit line. On the other hand, when storage data of the memory cell is "1", that is, when electrons are not stored in the n+-type region 6, the potential of the n+-type region 81a, which has been so far held at an intermediate level, is increased by that conduction. Such potential change of the bit line is sensed by the sense amplifier so that the same is amplified and extracted, while the same storage data is refreshed to be rewritten in the memory cell in the same cycle.

In the conventional semiconductor memory device shown in FIG. 1, since the source/drain region and the charge storage region are formed of an n+-type region or an n+-type inversion layer, electrons out of electron-hole pairs generated upon incidence of radioactive rays such as alpha rays into a memory chip are collected in the n+-type regions 6 and 80a and the n+-type region 81a, so that there occurs malfunctions (referred to as soft errors hereinafter) in which original storage data is inverted.

A method for preventing soft errors induced by such alpha rays is disclosed in, for example, an article by George A. Sai-Halasz et al., entitled "Alpha-Particle-Induced Soft Error Rate in VLSI Circuits", IEEE TRANSACTIONS ON ELECTRON DEVICES, Vol. ED-29, No. 4, April, 1982, pp. 725-731.

In order to solve the above described problem, means for preventing soft errors has been known by forming the p+-type region 11 to come into contact with the n+-type region 6 serving as a charge storage region, to increase memory cell capacitance, that is, critical charge capacitance so that malfunctions may not be caused even if electrons generated by radioactive rays such as alpha rays are generated in the n+-type region 6. However, the n+-type region 80a and the n+-type region 81a connected to a bit line is not protected from collection of electrons, and soft errors in a bit line mode depending on the cycle time of memory operation are still caused.

If p+-type regions are additionally provided around the n+-type regions 80a and 81a, the p+-type regions are arranged opposed to each other within a narrow spacing to cause operation of a parasitic pnp transistor, so that it becomes difficult to operate the transfer gate transistor stably.

SUMMARY OF THE INVENTION

Briefly stated, the present invention provides a method of manufacturing a semiconductor memory device comprising the steps of preparing a semiconductor substrate of a first conductivity type; forming a memory cell portion including a charge storage region of a second conductivity type on the semiconductor substrate; forming an insulator film on the region on the semiconductor substrate where a transfer gate transistor is to be defined for reading out charges from the charge storage region; forming a polysilicon film on the insulator film; forming a resist film pattern in a predetermined portion on the polysilicon film; selectively etching the polysilicon film and the insulator film utilizing the resist film pattern as a mask to form a gate insulator film on the semiconductor substrate and to form a gate electrode on the gate insulator film; ion-implanting impurities of the first conductivity type from the exposed surface of the semiconductor substrate utilizing the resist film pattern as a mask to form first and second semiconductor regions of the first conductivity type having higher impurity concentration than that of the semiconductor substrate, on the portions of the semiconductor substrate on one and the other sides of the gate electrode, respectively; etching the side walls of the gate electrode and the gate insulator film so that they may be located inside the side wall of the resist film; removing the resist film pattern; ion-implanting impurities of the second conductivity type from the surfaces of the first and second semiconductor regions and the exposed surface of the semiconductor substrate utilizing the gate electrode as a mask to form a third semiconductor region of the second conductivity type serving as one source/drain region on the first semiconductor region and semiconductor substrate on one side of the gate electrode so that it may be connected to the charge storage region and be shallower than the first semiconductor region and to form a fourth semiconductor region of the second conductivity type serving as the other source/drain region on the second semiconductor region and semiconductor substrate on the other side of the gate electrode so that it may be shallower than the second semiconductor region; heat-treating the first, second, third and fourth semiconductor regions so that these regions are activated and diffused; and interconnecting a bit line so that it may be connected to the fourth semiconductor region.

In accordance with another aspect of the present invention, the method of manufacturing the semiconductor memory device further comprises a step of forming an interlayer insulation film of low dielectric constant between the fourth semiconductor region and the bit line.

In accordance with still another aspect of the present invention, the method of manufacturing the semiconductor memory device further comprises a step of forming a protective film of low dielectric constant on the bit line.

Accordingly, a principal object of the present invention is to provide a method of manufacturing a semiconductor memory device capable of preventing soft errors caused by radioactive rays such as alpha rays while maintaining a fine structure and stable operation of a memory transistor.

A principal advantage of the present invention is that occurrence of soft errors caused by alpha rays or the like can be prevented by forming the semiconductor region of the first conductivity type having high impurity concentration so that it may come into contact with the source/drain region of the second conductivity type as well as the charge storage region of the second conductivity type.

Another advantage of the present invention is that since an end on the side of the gate electrode in the first semiconductor region of the first conductivity type is located inside the third semiconductor region of the second conductivity type and an end on the side of the gate electrode in the second semiconductor region of the first conductivity type is located inside the fourth semiconductor region of the second conductivity type, operation of a parasitic pnp transistor is not caused even in the fine structure.

Still another advantage of the present invention is that stray capacitance of a bit line can be reduced by forming an interlayer insulation film or a protective film for the bit line so that the voltage of signals sensed by the sense amplifier can be increased.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 2:
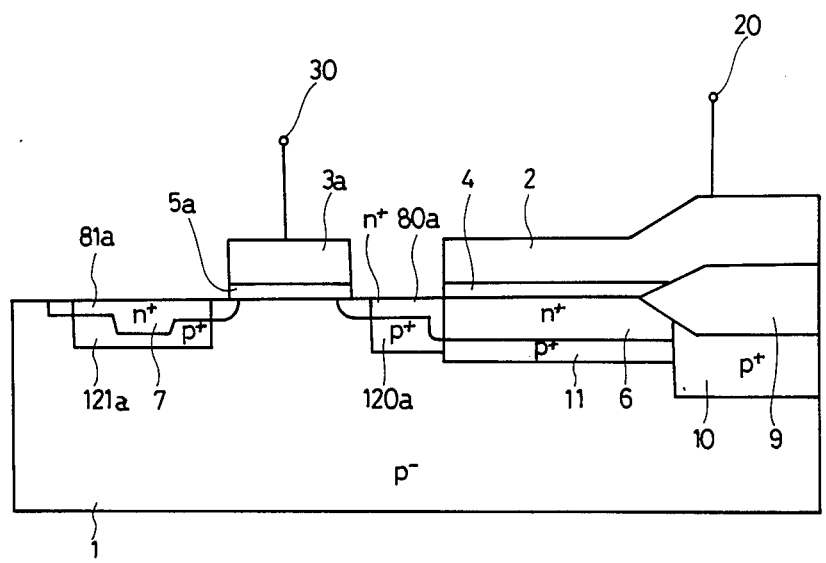
FIG. 2 is a cross sectional view showing a structure of a peripheral portion of a memory cell of a semiconductor memory device according to an embodiment of the present invention.

FIG. 2 is a cross sectional view showing a structure of a peripheral portion of a memory cell of a semiconductor memory device according to an embodiment of the present invention.

Figure 1:
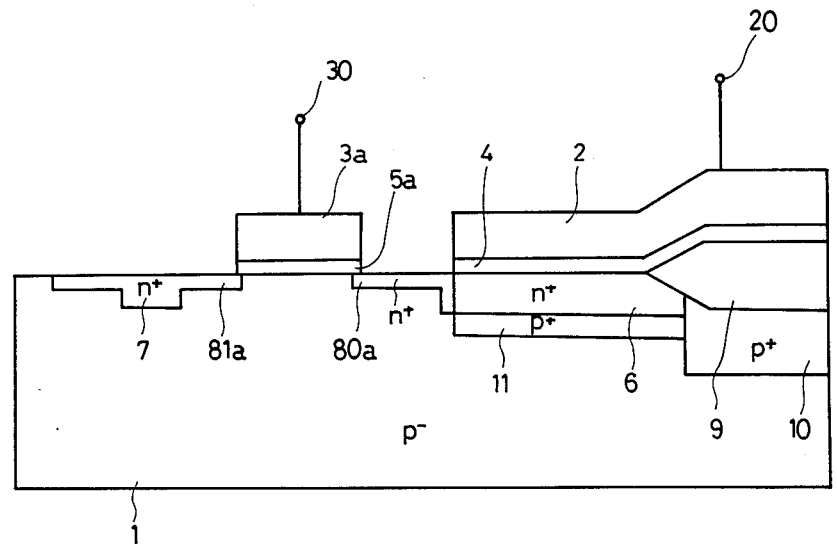
FIG. 1 is a cross sectional view showing a structure of a peripheral portion of a memory cell of a conventional dynamic RAM.

The structure of the peripheral portion of the memory cell shown in FIG. 2 is identical to that of the conventional memory cell shown in FIG. 1, except for the following: a p+-type region 120a having higher impurity concentration, by more than one figure, than that of a semiconductor substrate 1 is formed on the p−-type semiconductor substrate 1 so that it may come into contact with the n+-type region 80a serving as one source/drain region and communicate with a p+-type region 11, and an end on the side of a second gate electrode 3a in the p+-type region 120a is located inside an n+-type region 80a. In addition, a p+-type region 121a having higher impurity concentration, by more than one figure, than that of the semiconductor substrate 1 is formed on the p−-type semiconductor substrate 1 so that it may come into contact with an n+-type region 81a connected to a bit line (not shown) and serving as the other source/drain region, and an end on the side of the second gate electrode 3a in the p+-type region 121a is located inside the n+-type region 81a.

Impurity concentration of the p−-type semiconductor substrate 1 is, for example, about $1 \times 10^{14}$ to $1 \times 10^{16}$ cm$^{-3}$, and that of the p+-type regions 120a and 121a are, for example, about $1 \times 10^{15}$ to $1 \times 10^{17}$ cm$^{-3}$.

FIGS. 3A to 3D are cross sectional views showing principal steps/stages in a method of manufacturing the semiconductor memory device shown in FIG. 2.

With reference to FIGS. 3A to 3D, description is now made on the method of manufacturing the semiconductor memory device shown in FIG. 2.

Figure 3A:
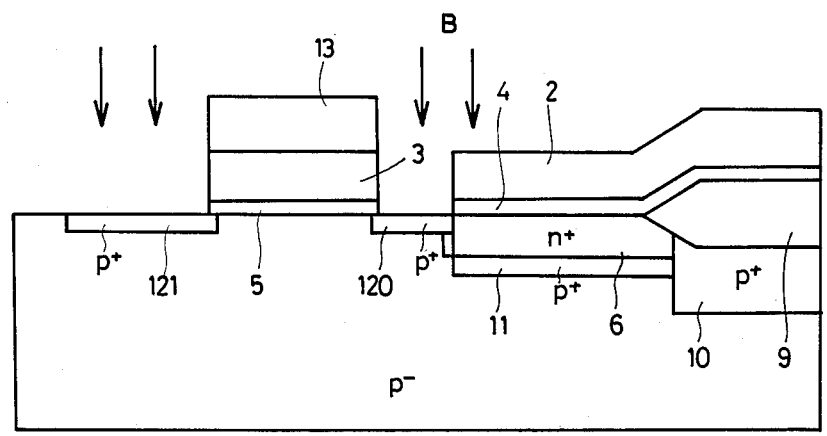
FIGS. 3A to 3D are cross sectional views showing principal steps/stages in a method of manufacturing the semiconductor memory device shown in FIG. 2.

Referring now to FIG. 3A, a p+-type region 10 is formed on the p−-type semiconductor substrate 1, and the insulator film 9 is formed on the p+-type region 10. Then, a p+-type region 11 is formed on the p−-type semiconductor substrate 1, and an n+-type region 6 is formed on the p+-type region 11. The n+-type region 6 may be formed on the p−-type semiconductor substrate 1 and then, the p+-type region 11 may be formed thereon. Then, a first gate insulator film 4 is formed on the n+-type region 6 and the insulator film 9, and a first gate electrode 2 is formed on the first gate insulator film 4. After an insulation region and a memory cell region are formed by a conventional process, an insulator film (not shown) is formed on the region to form a transfer gate transistor, on the p−-type semiconductor substrate 1, a polysilicon film (not shown) is formed on the insulator film by, for example, CVD and then, a resist film pattern 13 is formed on the polysilicon film. Then, the polysilicon film and the insulator film are selectively etched utilizing the resist film pattern 13 as a mask to form a second gate electrode 3 and a second gate insulator film 5. The width of the resist film pattern 13 is predetermined such that the widths of the second gate electrode 3 and the second gate insulator film 5 are larger, by approximately 1 μm, than the original width of the gate electrode. Then, a p-type impurity B is ion-implanted into the p−-type semiconductor substrate 1 from the exposed surface thereof utilizing the resist film pattern 13 and the first gate electrode 2 as masks to form p+-type regions 120 and 121.

Figure 3B:
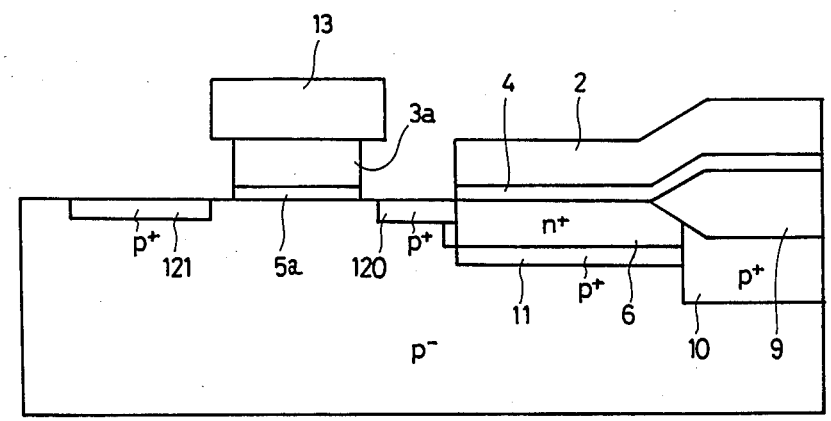

Referring now to FIG. 3B, the side walls of the second gate electrode 3 and the second gate insulator film 5 are over-etched till the widths thereof becomes a predetermined set value, so that the second gate electrode 3a and the second gate insulator film 5a each having the original width are formed.

Figure 3C:
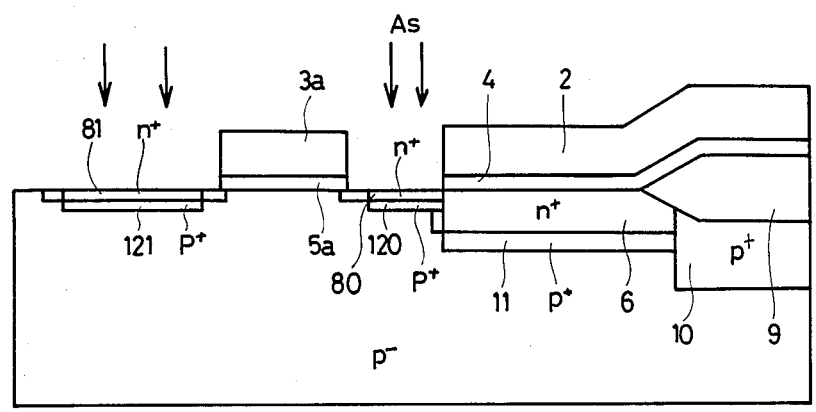

Referring now to FIG. 3C, after removing the resist film pattern 13, an n-type impurity As is ion-implanted into the p+-type regions 120 and 121 and the p−-type semiconductor substrate 1 from the surface of the p+-type region 120, the surface of the p+-type region 121 and the exposed surface of the p−-type semiconductor substrate 1 utilizing the second gate electrode 3a and the first gate electrode 2 as masks, whereby an n+-type region 80 serving as one source/drain region and an n+-type region 81 connected to a bit line (not shown) and serving as the other source/drain region are formed, respectively.

Figure 3D:
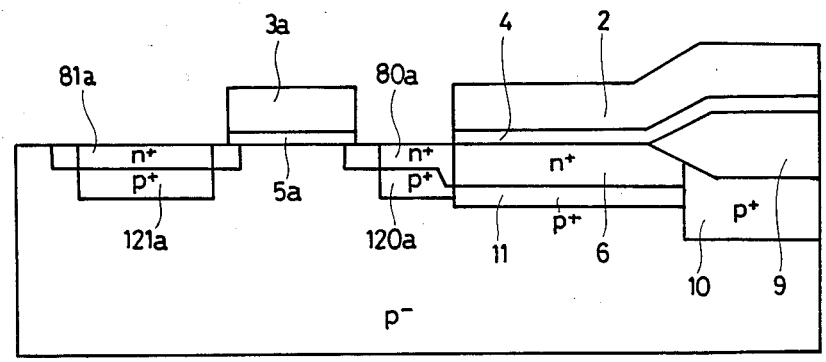

Referring now to FIG. 3D, the regions including the n+-type regions 80 and 81 and the p+-type regions 120 and 121 are heat-treated at a temperature of about 900 to 950° C., so that each of the regions is activated and diffused. As a result, n+-type regions 80a and 81a and p+-type regions 120a and 121a as shown in FIG. 3D are formed. The condition for ion-implanting p-type impurities is previously established such that the p+-type regions 120a and 121a are deeper than junction of the n+-type regions 80a and 81a, an end on the side of the second gate electrode 3a in the p+-type region 120a is located inside the n+-type region 80a, an end on the side of the second gate electrode 3a in the p+-type region 121a is located inside the n+-type region 81a, and the p+-type regions 120a and 121a have higher impurity concentration, by more than one figure, than that of the p−-type semiconductor substrate 1.

N-type impurities are ion-implanted into the n+-type region 81a and the p+-type region 121a from the surface of the n+-type region 81a, so that a downward convex portion 7 is formed in the center of the bottom portion of the n+-type region 81a, whereby the peripheral portion of the memory cell with the structure shown in FIG. 2 is completed.

Description is now made on the operation of the peripheral portion of the memory cell shown in FIG. 2. The above described soft errors in a bit line mode is caused since electrons out of electron-hole pairs generated upon incidence of radioactive rays such as alpha rays into a semiconductor chip are collected in the n+-type regions 80a and 81a. More specifically, alpha rays entering the semiconductor chip generate a large number of electron-hole pairs along the range thereof before being stopped by losing energy. Particularly, the electron-hole pairs generated in a depletion layer between the n+-type region 80a and the p+-type region 120a and the p−-type semiconductor substrate 1, and a depletion layer between the n+-type region 81a and p+-type region 121a and the p−-type semiconductor substrate 1 are immediately separated by the electric fields in the depletion layers, so that electrons are collected in the n+-type regions 80a and 81a and the holes flow down through the p−-type semiconductor substrate 1. The electron-hole pairs generated within the n+-type regions 80a and 81a are recombined and hence, the same exert no influence on increase or decrease of the electrons within the n+-type regions 80a and 81a. Furthermore, out of the electron-hole pairs generated in the p−-type semiconductor substrate 1, only electrons reaching the depletion layers by diffusion are collected in the n+type regions 80a and 81a to cause soft errors, while the remaining electrons are recombined in the p−-type semiconductor substrate 1.

However, in the peripheral portion of the memory cell according to the above described embodiment, since the p+-type regions 120a and 121a having higher impurity concentration, by one figure, than that of the p−-type semiconductor substrate are formed such that they come into contact with the n+-type regions 80a and 81a, respectively, the depletion layer between the n+-type region 80a and the p+-type region 120a and the depletion layer between the n+-type region 81a and the p+-type region 121a are both reduced in width, whereby the n+-type regions 80a and 81a are increased in capacity. Thus, the difference between electron numbers corresponding to "0" and "1" stored in the n+-type regions 80a and 81a is increased to provide allowance with respect to the electrons generated by incidence of alpha rays. Furthermore, the life time of the electrons diffused from the p−-type semiconductor substrate 1 is reduced within the p+-type regions 120a and 121a, so that it becomes difficult to reach the n+-type regions 80a and 81a. In addition, a potential barrier against the electrons is formed in the interfaces between the p+-type region 120a and the p−-type semiconductor substrate 1 and between the p+-type region 121a and the p−-type semiconductor substrate 1, to prevent passage of low-energy electrons of the electrons diffused from the p−-type semiconductor substrate 1, so that occurrence of soft errors in a bit line mode can be prevented.

Additionally, an end on the side of the second gate electrode 3a in the p+-type region 120a is located inside the n+-type region 80a and an end on the side of the second gate electrode 3a in the p+-type region 121a is located inside the n+-type region 81a. Therefore, a parasitic pnp transistor is not caused in a transfer gate transistor and hence, the transfer gate transistor can operate stably.

As shown in the above described embodiment, since the n+-type region 81a connected to a bit line (not shown) is in contact with the p+-type region 121a, depletion layer capacitance of junction and stray capacitance $C_B$ of the bit line are increased. The voltage V of signals sensed by a sense amplifier is given by;

$$V = (V_D - V_T)/\{1 + (C_B/C_S)\}$$

wherein $V_D$ is the gate voltage of a transfer gate transistor, $V_T$ is the threshold voltage of the transfer gate transistor and $C_S$ is memory cell capacitance. Therefore, if stray capacitance $C_B$ becomes large, the signal voltage becomes small and the operation as a memory device becomes unstable. Therefore, increase in stray capacitance $C_B$ must be prevented. An interlayer insulation film such as a silicon oxide film and a phosphorus glass film of low dielectric constant is formed between the bit line and the n+-type region 81a and a protective film of the same material is formed on the bit line, so that stray capacitance $C_B$ can be reduced.

Although the above described embodiment has shown an example of forming the p+-type regions 120a and 121a to come into contact with the n+-type regions 80a and 81a, the p+-type region may be formed to come into contact with an n+-type region of a sense amplifier and an n+-type region of a peripheral circuit so that soft errors caused in these regions can be reduced.

Although the above description has been made with reference to a dynamic RAM, the present invention is also applicable to a static RAM. In addition, the n channel may be replaced by a p channel and the MOS device may be replaced by a bipolar device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor memory device comprising the steps of:
    preparing a semiconductor substrate of a first conductivity type;
    forming a memory cell portion including a charge storage region of a second conductivity type on said semiconductor substrate;
    forming an insulator film on the region on said semiconductor substrate where a transfer gate transistor is to be defined for reading out charges from said charge storage region;
    forming a polysilicon film on said insulator film;
    forming a resist film pattern in a predetermined portion on said polysilicon film;
    selectively etching said polysilicon film and said insulator film utilizing said resist film pattern as a mask, to form a gate insulator film on said semiconductor substrate and to form a gate electrode on said gate insulator film;
    ion-implanting impurities of the first conductivity type from the exposed surface of said semiconductor substrate utilizing said resist film pattern as a mask, to form first and second semiconductor regions of the first conductivity type having higher impurity concentration than that of said semiconductor substrate, on the portions of said semiconductor substrates on one and the other sides of said gate electrode, respectively;
    etching the side walls of said gate electrode and said gate insulator film so that they are located inside the side wall of said resist film;
    removing said resist film pattern;
    ion-implanting impurities of the second conductivity type from the surfaces of said first and second semiconductor regions and the exposed surface of said semiconductor substrate utilizing said gate electrode as a mask, to form a third semiconductor region of the second conductivity type serving as one source/drain region on said first semiconductor region and said semiconductor substrate on one side of said gate electrode so that it may be connected to said charge storage region and it may be shallower than said first semiconductor region, and to form a fourth semiconductor region of the second conductivity type serving as the other source/drain region on said second semiconductor region and said semiconductor substrate on the other side of said gate electrode so that it may be shallower than said second semiconductor region;
    heat-treating said first, second, third and fourth semiconductor regions so that these regions are activated and diffused; and
    interconnecting a bit line so that it may be connected to said fourth semiconductor region.

2. A method of manufacturing a semiconductor memory device in accordance with claim 1, wherein
    said step of forming said memory cell portion comprises the steps of:
    forming a fifth semiconductor region of the first conductivity type having higher impurity concentration than that of said semiconductor substrate, on the region on said semiconductor substrate where said memory cell portion is to be defined;
    forming said charge storage region of the second conductivity type on said fifth semiconductor region;
    forming a gate insulator film for a memory cell on said charge storage region; and
    forming a gate electrode for a memory cell on said gate insulator film for a memory cell.

3. A method of manufacturing a semiconductor memory device in accordance with claim 1, further comprising a step of:
    ion-implanting impurities of the second conductivity type from the surface of said fourth semiconductor region, to form a downward convex portion in the center of the bottom portion in said fourth semiconductor region.

4. A method of manufacturing a semiconductor memory device in accordance with claim 1, wherein said semiconductor substrate of the first conductivity type has impurity concentration of $1 \times 10^{14}$ to $1 \times 10^{16}$ cm$^{-3}$, and said first and second semiconductor regions have impurity concentration of $1 \times 10^{15}$ to $1 \times 10^{17}$ cm$^{-3}$.

5. A method of manufacturing a semiconductor memory device in accordance with claim 1 further comprising a step of:

forming an interlayer insulation film of low dielectric constant between said fourth semiconductor region and said bit line.

6. A method of manufacturing a semiconductor memory device in accordance with claim 5, wherein said interlayer insulation film comprises a silicon oxide film or a phosphorus glass film.

7. A method of manufacturing a semiconductor memory device in accordance with claim 1, further comprising a step of:

forming a protective film of low dielectric constant on said bit line.

8. A method of manufacturing a semiconductor memory device in accordance with claim 7, wherein said protective film comprises a silicon oxide film or a phosphorus glass film.

* * * * *